United States Patent [19]

Maurer

[11] Patent Number: 5,634,230
[45] Date of Patent: Jun. 3, 1997

[54] APPARATUS AND METHOD FOR CLEANING PHOTOMASKS

[75] Inventor: Wilhelm Maurer, Hopewell Junction, N.Y.

[73] Assignee: Siemens Aktiengesellschaft, Munich, Germany

[21] Appl. No.: 647,154

[22] Filed: May 9, 1996

Related U.S. Application Data

[63] Continuation of Ser. No. 364,165, Dec. 27, 1994, abandoned.

[51] Int. Cl.⁶ .............................. A47L 13/40; A47L 5/00
[52] U.S. Cl. .............................. 15/1.51; 15/3; 15/312.1; 15/31.9
[58] Field of Search .............................. 15/3, 301, 304, 15/319, 312.1, 1.51

[56] References Cited

U.S. PATENT DOCUMENTS

| | | |
|---|---|---|
| 3,877,371 | 4/1975 | Jaffa . |
| 4,470,508 | 9/1984 | Yen . |
| 4,486,238 | 12/1984 | Bando ............................ 15/312.1 |
| 4,606,747 | 8/1986 | Steinhoff . |
| 4,677,704 | 7/1987 | Huggins . |
| 4,715,392 | 12/1987 | Abe et al. . |
| 4,737,387 | 4/1988 | Yen . |
| 4,744,833 | 5/1988 | Cooper et al. . |
| 4,776,462 | 10/1988 | Kosugi et al. . |
| 4,811,443 | 3/1989 | Nishizawa . |
| 4,853,922 | 8/1989 | Funaki . |
| 4,980,536 | 12/1990 | Asch et al. . |
| 5,000,203 | 3/1991 | Hamada . |
| 5,023,424 | 6/1991 | Vaught . |
| 5,085,899 | 2/1992 | Nakagawa et al. . |
| 5,098,501 | 3/1992 | Nishiguchi . |
| 5,125,040 | 6/1992 | Matsui et al. . |
| 5,168,001 | 12/1992 | Legare et al. . |
| 5,314,068 | 5/1994 | Nakazato et al. . |
| 5,350,428 | 9/1994 | Leroux et al. . |
| 5,353,934 | 10/1994 | Yamauchi . |
| 5,361,453 | 11/1994 | Gerber ............................ 15/3 |

*Primary Examiner*—David Scherbel
*Assistant Examiner*—Randall Chin
*Attorney, Agent, or Firm*—Adel A. Ahmed; Dexter K. Chin

[57] ABSTRACT

An apparatus and associated method for removing microscopic particle contaminants from an object such as a photomask or a semiconductor wafer. The apparatus utilizes an inspection device to identify the position of any particle contaminants on the target object. Once the positions of the various particle contaminants has been identified, a probe is dispatched to the position of one of the particle contaminants. The probe removes the particle contaminant from the target object and moves to a cleaning compartment, wherein the particle contaminant is removed from the probe. The probe is then moved to the next subsequent particle contaminant until all the contaminants are removed from the target object. By removing particle contaminants one-by-one from the target object, the manufacturing yield of zero defect products is greatly increased.

6 Claims, 3 Drawing Sheets

APPARATUS AND METHOD FOR CLEANING PHOTOMASKS

CROSS-REFERENCE TO RELATED APPLICATION

This is a continuation of Ser. No. 08/364,165 filed Dec. 27, 1994 now abandoned.

FIELD OF THE INVENTION

The present invention relates to methods and devices for removing undesired particles from a photomask that may cause defects during semiconductor lithography. More particularly, the present invention relates to a method and device wherein defect particles are identified on a photomask and a cleaning probe is dispatched to physically remove the particles one-by-one.

BACKGROUND OF THE INVENTION

The presence of an undesired particle on a photomask may create a corresponding defect in a semiconductor wafer when the contaminated photomask is used for semiconductor lithography. Due to the high degree of miniaturization used on many semiconductor devices, even the smallest of particles may render the resultant semiconductor device useless.

Photomasks are often used multiple times over an extended period of time. In order to keep the photomasks clean between uses, protective pellicle layers are typically mounted above the photomasks. Protective pellicle layers are typically transparent membranes supported by a frame. The pellicle layer is supported a predetermined distance from the photomask so that particulates that fall onto the mask are caught on the pellicle layer and are held out of focus during lithography, so as not to be disruptive.

If a particulate finds its way past the protective pellicle layer, the pellicle layer is typically removed and scraped. The photomask is then cleaned and a new pellicle layer is placed over the photomask. The expense of scraping the original pellicle layer, cleaning the photomask and replacing the pellicle layer adds greatly to the cost of using and maintaining photomasks.

In the prior art record, there are many devices that are used to wash or otherwise clean photomasks after the pellicle layer is removed or prior to the initial application of the pellicle layer. Such prior art devices are exemplified by U.S. Pat. No. 4,715,392 to Abe et al., entitled AUTOMATIC PHOTOMASK OR RETICLE WASHING AND CLEANING SYSTEM and U.S. Pat. No. 4,811,443 to Nishizawa, entitled APPARATUS FOR WASHING OPPOSITE SURFACES ON A SUBSTRATE. The problem with such prior art washing devices is that they only produce a limited percentage of photomasks with zero defects. A higher percentage of photomasks are produced with limited defects. The photomasks with limited defects must either be used in their defective state, scrapped or washed again. The problems associated with washing photomasks multiple times include the time and labor involved in repeatedly performing the washing procedures. Furthermore, defect particles that were not removed by a first washing tend to have characteristics that make those particles impervious to subsequent washings. Recognizing that it is neither cost effective nor time effective to wash photomasks multiple times, supplemental prior art devices have been developed to specifically target and remove defect particles that survive an initial washing procedure. A common prior art approach is to use a laser to burn away any defect particle. Such prior art devices are exemplified by U.S. Pat. No. 4,980,536 to Asch et al, entitled REMOVAL OF PARTICLES FROM SOLID-STATE SURFACES BY LASER BOMBARDMENT and U.S. Pat. No. 5,023,424 to Vaught, entitled SHOCK WAVE PARTICLE REMOVAL METHOD AND APPARATUS. The use of lasers, however, has drawbacks because the removed particle may leave residue when burned or may not burn. Furthermore, on certain photomasks the energy from the laser may be too intense and may harm the photomask before the targeted particle has been removed. The use of lasers, however, has been preferred and its drawbacks ignored, because it is one of the most practical methods of removing a defect from a photomask without having to scrap an existing pellicle layer. The laser is simply focused through the pellicle layer and onto the below lying photomask.

Another prior art method of removing contaminants from photomasks is by the use of pneumatic vibrations. Such a prior art system is exemplified by U.S. Pat. No. 4,677,704 to Huggins, entitled CLEANING SYSTEM FOR STATIC CHARGED SEMICONDUCTOR WAFER SURFACE. Pneumatic systems are complex and often are incapable of removing a firmly placed contaminant particle without damaging the substrate on which the contaminant rests. This method, however, also requires that the pellicle layer protecting the photomask be removed.

Electrostatic forces are also used to remove contaminant particles from photomasks. Prior art electrostatic devices typically apply a charged surface across the entire area of the photomask, hoping to attract any and all contaminant particles present on the photomask. Such prior art systems are exemplified by U.S. Pat. No. 4,744,833 to Cooper et al, entitled ELECTROSTATIC REMOVAL OF CONTAMINANTS. A problem with such systems is that by placing a charged plate above the photomask, particles in depressions on the photomask are exposed to a lesser attraction force than are those particles on the upper most levels of photomasks. Furthermore, the charged plate can only by brought within a given distance of the photomasks to avoid physical contact with the photomask and avoid certain electrical arcing problems. To use electrostatic systems, the pellicle layer must again be removed so that contaminant particles can reach the electrostatically charged surface.

In view of the problems inherent in prior art devices, it is therefore an objective of the present invention to provide a device and method for physically removing contaminant particles from a photomask one particle at a time, thereby positively eliminating all defects without concern of incidental damage to the photomask.

It is a further object of the present invention to provide a device for cleaning a photomask without having to remove and scrap the protective pellicle layer used to protect the photomask.

SUMMARY OF THE INVENTION

The present invention is an apparatus and associated method for removing microscopic particle contaminants from an object such as a photomask. The apparatus utilizes an inspection device to inspect the photomasks and identify the position of any particle contaminants on the photomask. Once the positions of the various particle contaminants has been identified, a probe is dispatched to the position of one of the particle contaminants. The probe extends into the space between the photomask and the pellicle layer positioned above the photomask. The probe removes the particle contaminant from the photomask and moves to a cleaning compartment, wherein the particle contaminant is removed from the probe. The probe is then moved to the next subsequent particle contaminant until all the contaminants are removed from the photomasks. By removing particle contaminants one-by-one from the photomask, all contaminant particles can be removed without removing or damaging the protective pellicle layer mounted above the photomask.

BRIEF DESCRIPTION OF THE DRAWINGS

The present invention will be more fully understood by referring to the following detailed description, the above background and the claims appended hereto, when considered in connection with the accompanying drawings, wherein;

DETAILED DESCRIPTION OF THE INVENTION

Although the present invention can be used in many different applications where it is desired to remove contaminant particles from an object, such as a semiconductor wafer, printed circuit or the like, the present invention is especially suitable for use in cleaning photomasks. Accordingly, the present invention apparatus and method will be described in connection with a photomask to thereby present the best mode contemplated for the invention.

Figure 1:
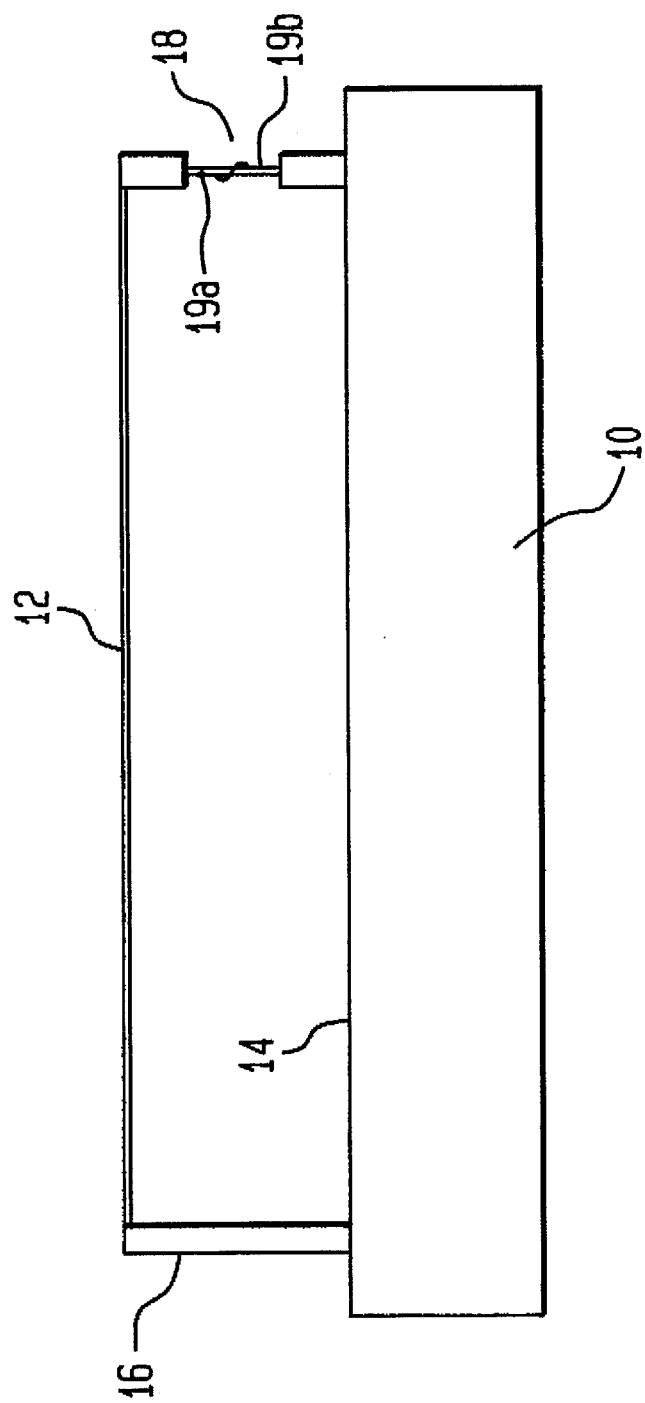
FIG. 1 shows a photomask with a frame and protective pellicle layer.

Referring to FIG. 1 there is shown a photomask 10 having a protective pellicle layer 12 suspended over the top surface 14 of the photomask 10 by a frame assembly 16. The frame assembly 16 contains at least one opening 18 that can be selectively opened and closed. Although the shown embodiment illustrates a frame assembly 16 with an opening 18 on only one side surface, it should be understood that similar openings may be present on any number of the side surfaces. In the shown embodiment, the opening 18 is fabricated from two overlapping 19a, 19b pieces of pellicle material. As will later be explained, when a probe or other object passes into the opening 18, the overlapping pieces 19a, 19b part. When the probe is removed the overlapping pieces 19a, 19b return to their original orientations thereby isolating the environment directly over the photomask 10.

Figure 2:
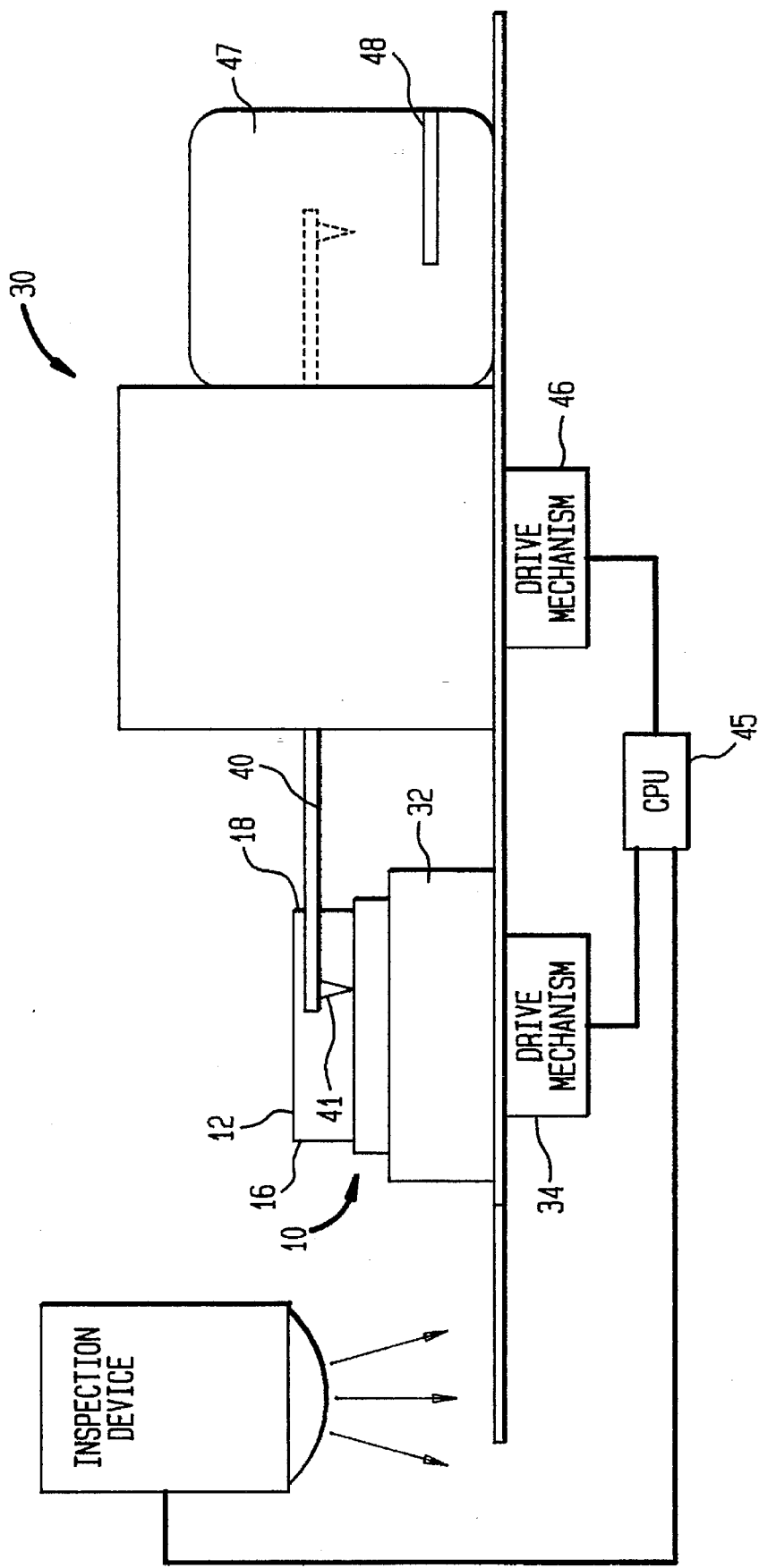
FIG. 2 is a block diagram schematic of one preferred embodiment of the present invention.

Referring to FIG. 2, an automated cleaning assembly 30 is shown. The photomask 10 is placed on a support stage 32, either by hand or by an automated loading mechanism. The support stage 32 is coupled to a drive mechanism 34 that moves the photomask 10 between an inspection position and a cleaning position. Initially the photomask 10 is placed in the inspection position wherein the photomask 10 is inspected for particle contaminants. There are many commonly used methods for inspecting photomasks for particle contaminants. One common inspection technique uses laser scanning microscopy. A description of the apparatus and method used to detect particle contaminant by laser scanning microscopy is shown in a paper entitled LASER SCANNING MICROSCOPY by Alford et al., Proc. IEEE, vol. 70, pp. 641–651, June 1982.

Once the photomask 10 has been inspected, the photomask 10 is moved into the cleaning position, wherein a probe 40 is placed through the opening 18 in the pellicle frame 16. As a result, the tip 41 of the probe 40 is disposed between the pellicle layer 12 and the photomask 10. The location of any particle contaminants found during the inspection are read into the central processing unit (CPU) 45. The probe 40 is moved by a drive mechanism 46 capable of moving the probe 40 in the horizontal XY plane as well as the vertical Z plane. The drive mechanism 46 is coupled to the CPU 45, whereby the coordinates of a selected particle contaminant are read from the CPU 45 to the drive mechanism 46. Through the control of the CPU 45, the probe 40 can be moved through the horizontal X and Y planes to any point above the photomask 10. The tip 41 of the probe 40 is then lowered through the vertical plane to a point that contacts, or almost contacts the targeted contaminant particle on the photomask 10.

The probe 40 can have several forms, and may engage a contaminant particle on the photomask 10 using a variety of techniques. For instance, the probe tip 41 may actually contact the contaminant particle on the photomask 10 and try to remove that particle using the forces of surface tension, adhesion, electrostatic interaction or the like. The probe 40 may be coated with an adhesive capable of engaging and removing contaminant particles on the photomask 10 without leaving residue on the photomask. In an alternate embodiment, the probe 40 may have a center capillary attached to a vacuum source, wherein a contaminant particle can be pneumatically drawn into the probe 40. Physically touching the contaminant particle is the most effective way of ensuring the dislodgement and removal of the particle. However, by physically touching the particle on the photomask 10, the chances of damaging the fragile photomask 10 are greatly increased. As a result, in a preferred embodiment the tip 41 of the probe 40 is brought into close proximity of the contaminant particle, without physically contacting the particle. The probe 40 is then polarized and electrostatic forces are used to attract the contaminant particle away from the photomask 10 and onto the probe 40.

Once the probe 40 is retracted away from the photomask 10, the probe 40 turns into a cleaning chamber 47. Once in the cleaning chamber 47, the probe 40 is cleaned to remove the contaminant particles from the probe 40. The probe 40 can be cleaned in any conventional manner, but in the preferred embodiment electrostatic forces are used to repel the particle from the probe and attract the particle onto a removable filter plate 48. The removable filter plate 48 can then be replaced or cleaned as required.

Figure 3:
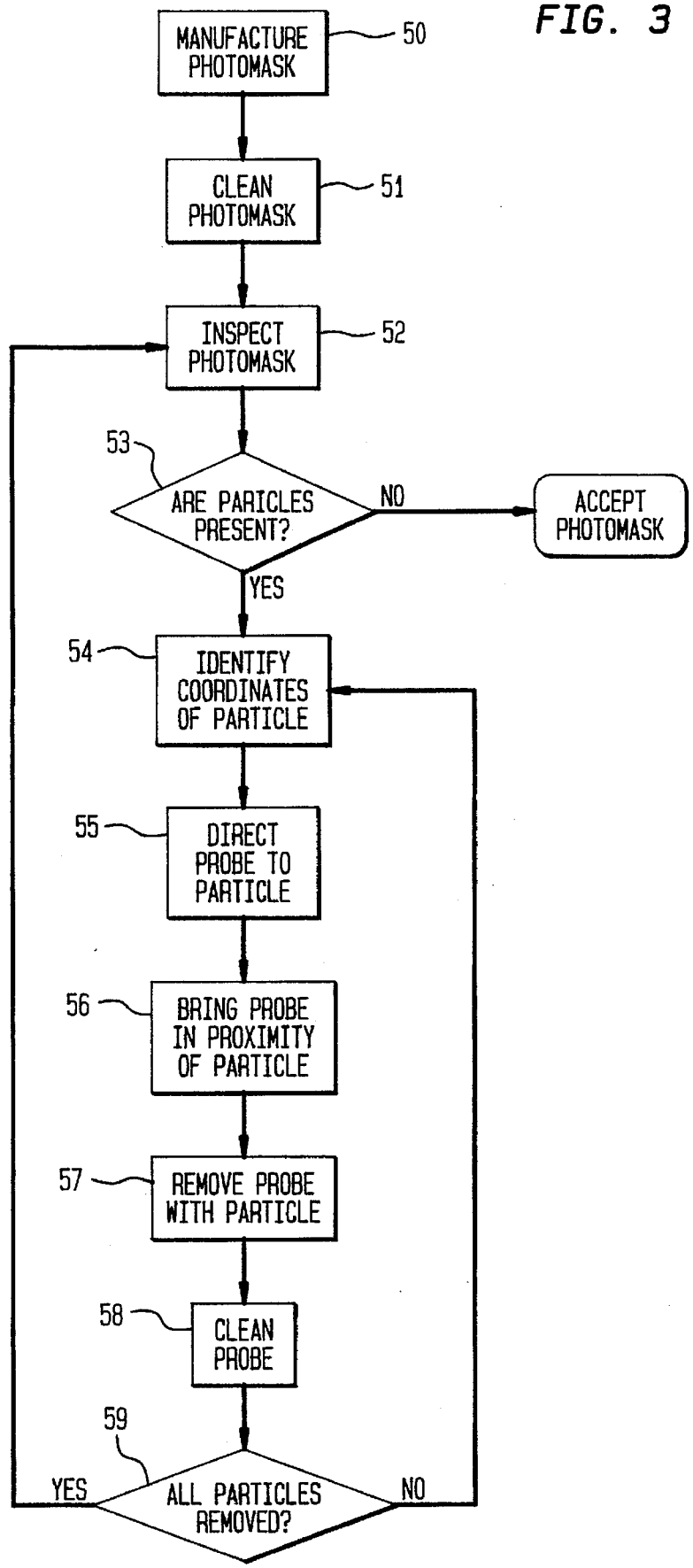
FIG. 3 is a logic flow diagram showing the method of operation of the preferred embodiment of the present invention.

Referring to FIG. 3, the logic flow of the present invention method of cleaning a photomask is expressed. The method illustrated is for the preferred embodiment of the apparatus previously explained. As seen from blocks 50 and 51, photomasks are manufactured and cleaned using conventional techniques. After the photomasks are cleaned, the photomasks are placed in an inspection chamber where they are inspected for contaminants. (See block 52). As expressed by block 53, if contaminant particles are not found, the photomask is assumed to have zero defects and is ready for use. If contaminant particles are found, the X and Y coordinates of those particles are read by a central control unit. (See block 54). Referring to block 55, it can be seen that the X and Y coordinates for the identified particles are used to drive a probe to those coordinates. When the tip of the probe reaches the coordinates of an identified particle, the probe is brought into close proximity of the particle in an attempt to attract that particle to the probe (see block 56). Referring to blocks 57 and 58, the probe is then removed, and the probe tip is cleaned. In block 59, if any of the previously identified particles found in the inspection procedure of block 52 are remaining on the screen, the procedure repeats at block 54. If, however, all the previously identified particles found in the inspection procedure of block 52 have been removed, the photomask is inspected again according to the procedure of block 52. If no particles are found (block 53), the photomasks is ready for use.

It will be understood that the specific embodiments of the present invention described herein are merely exemplary and are present to express the best mode of the invention. However, a person skilled in the art may make many variations and modifications to the described embodiments by using functionally equivalent components and processes. All such variations, modifications and alternate embodiments are intended to be considered within the scope of the invention as stated in the following claims.

What is claimed is:

1. A device for removing particle contaminants from the surface of a photomask protected by a pellicle layer, comprising:

a probe positionable between the photomask and the pellicle layer, wherein said probe has a means associated therewith for engaging and removing the particle contaminants;

locating means for finding the particle contaminants on the photomask; and positioning means responsive to said locating means, for positioning the probe adjacent to the particle contaminants.

2. The device according to claim 1, wherein said locating means includes a microprocessor for computing the location of the particle contaminants and said microprocessor controls said positioning means selectively moving said probe to the locations of the particle contaminants.

3. The device according to claim 1, wherein said probe is polarized to maintain an electrostatic charge.

4. The device according to claim 1, further including a means for cleaning the particle contaminants from said probe.

5. The device according to claim 1, wherein said probe includes means for attracting particle contaminants which are spaced slightly from said adjacently positioned probe, to said probe thereby removing the particle contaminants from the photomask.

6. The device according to claim 1, wherein said probe includes means for attaching particle contaminants which contact said adjacently positioned probe, to said probe thereby removing the particle contaminants from the photomask.

* * * * *